United States Patent
Nishimura (10) Patent No.: US 9,741,805 B2
(45) Date of Patent: Aug. 22, 2017

(54) SEMICONDUCTOR DEVICE AND METHOD FOR MANUFACTURING THE SEMICONDUCTOR DEVICE

(71) Applicant: FUJI ELECTRIC CO., LTD., Kawasaki-shi, Kanagawa (JP)

(72) Inventor: Takeyoshi Nishimura, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/929,912

(22) Filed: Nov. 2, 2015

(65) Prior Publication Data

US 2016/0163806 A1    Jun. 9, 2016

(30) Foreign Application Priority Data

Dec. 4, 2014 (JP) ................. 2014-245948

(51) Int. Cl.
  *H01L 29/417* (2006.01)
  *H01L 29/78* (2006.01)
  *H01L 29/10* (2006.01)
  *H01L 23/00* (2006.01)

(52) U.S. Cl.
  CPC ........ *H01L 29/41741* (2013.01); *H01L 24/04* (2013.01); *H01L 24/45* (2013.01); *H01L 24/48* (2013.01); *H01L 29/1095* (2013.01); *H01L 29/7813* (2013.01); *H01L 2224/45015* (2013.01); *H01L 2224/45124* (2013.01); *H01L 2224/4847* (2013.01); *H01L 2224/48455* (2013.01); *H01L 2924/00014* (2013.01); *H01L 2924/3512* (2013.01)

(58) Field of Classification Search
  CPC .......................................... H01L 24/04–24/09
  See application file for complete search history.

(56) References Cited

U.S. PATENT DOCUMENTS

| 4,705,204 A * | 11/1987 | Hirota ............... B23K 20/007 219/56.22 |
| 6,188,119 B1 | 2/2001 | Ogawa et al. |
| 2009/0174076 A1 | 7/2009 | Sasaki et al. |
| 2011/0204383 A1* | 8/2011 | Yamamoto .......... H01L 21/0495 257/77 |
| 2015/0325558 A1* | 11/2015 | Hikasa .................. H01L 29/16 257/49 |

FOREIGN PATENT DOCUMENTS

| JP | 10-223881 | 8/1998 |
| JP | 2005-303186 | 10/2005 |
| JP | 2009-88381 | 4/2009 |
| JP | 2009-272449 | 11/2009 |

* cited by examiner

*Primary Examiner* — Bryan Junge (57) ABSTRACT

A deterioration of a gate threshold voltage, which is caused by a stress and a thermal hysteresis when wire bonding for a surface of an electrode layer of a semiconductor device is performed, can be suppressed. The semiconductor device includes a metallic film provided at a surface of a semiconductor chip, and a wire bonded to an upper surface of the metallic film. The metallic film has a plurality of grains, particle diameters of the grains are substantially equal to or more than a thickness of the metallic film.

15 Claims, 7 Drawing Sheets

FIG. 7 ately 300 micrometers). Moreover, a thickness of
SEMICONDUCTOR DEVICE AND METHOD FOR MANUFACTURING THE SEMICONDUCTOR DEVICE

CROSS REFERENCE TO RELATED APPLICATIONS AND INCORPORATION BY REFERENCE

This application claims benefit of priority under 35 USC 119 based on Japanese Patent No. P2014-245948 filed Dec. 4, 2014, the entire contents of which are incorporated by reference herein.

BACKGROUND OF THE INVENTION

1. Field of the Invention

The present invention relates to a semiconductor device and a method for manufacturing the semiconductor device.

2. Description of the Related Art

For manufacturing semiconductor devices exemplified by diodes, integrated circuits (ICs) and the like, processes for connecting chip-like semiconductor devices, which are diced into a predetermined size from a wafer, to a fixing member such as a lead frame by soldering and the like, and then firmly adhering electrode layers, which are formed on upper surfaces of such semiconductor chips, and electrode terminals of the lead frame to each other by wire bonding, are executed.

In an event of wire bonding a metallic wire and a surface of a metallic electrode layer by bringing the metallic wire in contact with the metallic electrode layer, a damage such as a crack sometimes occurs in the electrode layer owing to power of ultrasonic waves. As a technology for suppressing such a wire bonding damage, there is proposed a method of adopting a double-layer structure for an interlayer insulating film to be formed under the electrode layer of the semiconductor device, and forming irregular portions between the upper and lower films of the double-layer structure, and thereby reducing the damage at a time of the wire bonding (refer to JP2005-303186A).

However, in semiconductor devices such as a metal-oxide-semiconductor field-effect transistor (MOSFET) and an insulated gate bipolar transistor (IGBT), which are used, for example, as power semiconductor devices, a relatively large current flows between the semiconductor device and an outside, and accordingly, it is necessary to increase a diameter of the wire for the bonding (for example, to approximately 300 micrometers). Moreover, a thickness of the electrode layer of the power semiconductor device approximately ranges from one to ten micrometers in usual, and accordingly, the diameter of the wire becomes much larger than the thickness of the electrode layer. Therefore, a load to the electrode layer by the wire bonding also becomes large, and accordingly, the damage such as the crack, which occurs in the semiconductor device, cannot be sufficiently reduced in some case even if the technology of JP2005-303186A is used. Then, among a variety of characteristics of the semiconductor device, which are deteriorated by the damage, in particular, a deterioration of a gate threshold voltage of the semiconductor device, which is caused by an influence of impurities such as movable ions contained in a package, is significant, and a method for solving the deterioration of the gate threshold voltage has been desired.

SUMMARY OF THE INVENTION

The present invention has been made by focusing on such a problem as described above, and it is an object of the present invention to provide a semiconductor device capable of suppressing the deterioration of the gate threshold voltage of the semiconductor device, the deterioration being caused by a stress and a thermal hysteresis when the wires are bonded, and a method for manufacturing the semiconductor device.

In order to solve the foregoing problem, an aspect of the present invention inheres in a semiconductor device encompassing a metallic film provided at a surface of a semiconductor chip, and a wire bonded to an upper surface of the metallic film, the metallic film has a plurality of grains, particle diameters of the grains are substantially equal to or more than a thickness of the metallic film. And, another aspect of the present invention inheres in a method for manufacturing a semiconductor device, encompassing forming a metallic film at a surface of a semiconductor chip so that particle diameters of grains in the metallic film are substantially equal to or more than a thickness of the metallic film, and bonding a wire onto an upper surface of the metallic film.

DETAILED DESCRIPTION OF THE INVENTION

A description is made below of embodiments of the present invention. In the following description referring to the drawings, the same or similar numerals are assigned to the same or similar portions. However, the drawings are schematic, and it should be noted that a relationship between a thickness and a planar dimension, a thickness ratio of each layer and a wire, and the like are different from actual ones. Hence, specific thickness and dimension should be determined in consideration of the following description. Moreover, as a matter of course, portions different in mutual dimensional relationships and ratios are incorporated also among the drawings. Furthermore, "right and left (crosswise)" and "up and down (vertical)" directions in the following description are merely definitions for convenience of explanation, and do not limit the technical idea of the present invention. Hence, for example, if a space of each of the drawings is rotated by 90 degrees, then "crosswise" and "vertical" are read so as to be exchanged, and if the space of each drawing is rotated by 180 degrees, then as a matter of course, "left" turns to "right", and "right" turns to "left".

Here, the "first principal electrode region" may be assigned as one of the emitter and collector electrode regions of an insulated gate bipolar transistor (IGBT), or one of the source and drain electrode regions of an insulated gate transistor (IGT) such as a MOSFET and a MOS static induction transistor (SIT). The "second principal electrode region" may be assigned as the other of the emitter and collector electrode regions, or the other of the source and drain electrode regions. For example, if the first principal electrode region is the emitter electrode region, the second principal electrode region is the collector electrode region, and if the first principal electrode region is the source electrode region, the second principal electrode region is the drain electrode region. Between the first and second principal electrode regions, a main current controlled by a control electrode structure flows so as to form a current path between the first and second principal electrode regions. Generally, switching elements are symmetrical, and therefore, the source and drain electrode regions thereof are replaceable with each other. For example, in the MOSFET, the source and drain electrode regions are only a matter of naming. As it will be appreciated, the terms drain and source regions can be exchanged without modifying the structure itself.

Moreover, in this specification and the accompanying drawings, in regions and layers, which are denoted by n and p, n and p stand for that electrons and holes are majority carriers in the subject regions or layers. Furthermore, superscript notations of + and −, which are added to n and p, stand for that regions concerned are semiconductor regions in which impurity concentrations are relatively higher and lower in comparison with semiconductor regions which are not added with superscript notations of + and −, respectively. Moreover, in the accompanying drawings, illustration of hatching of layers is partially omitted for enhancing visibility.

(Structure of Semiconductor Device)

Figure 1:
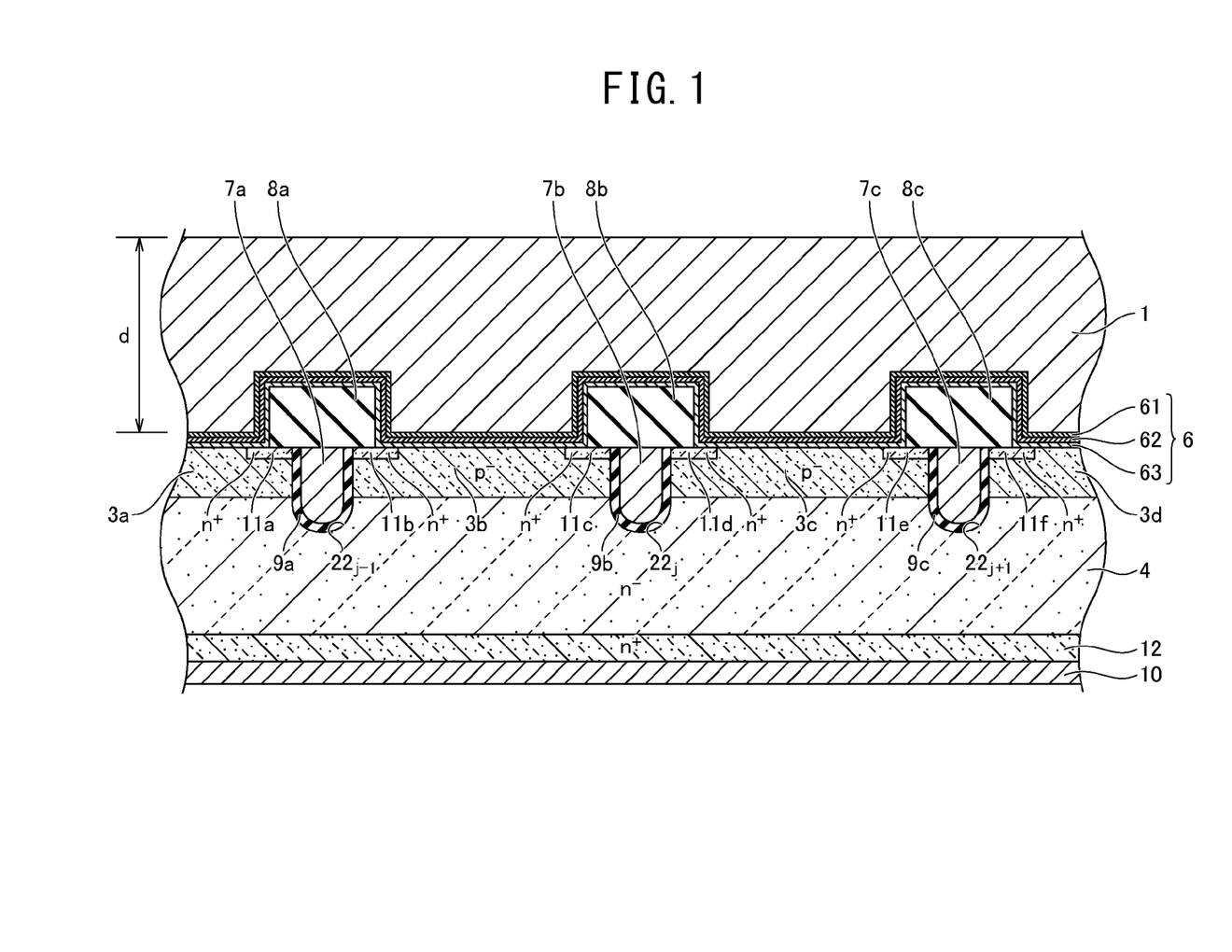
FIG. 1 is a partial cross-sectional view schematically explaining a semiconductor device according to an embodiment of the present invention.

FIG. 1 illustrates a cross-sectional structure of a trench-type MOSFET as an example of a semiconductor device according to an embodiment of the present invention. In a semiconductor device mounted on a package made of ceramics and the like, a wire is supposed to be bonded onto an upper surface of a metallic film (electrode layer) 1 provided at a surface of a semiconductor chip. The wire 2 is illustrated in a state of being joined to metallic films (electrode layers) 1a in FIG. 2. Here, as the semiconductor device, a structure as illustrated in FIG. 1 will be described, for example. As illustrated in FIG. 1, the structure of the semiconductor device includes a plurality of p⁻-type base regions 3a, 3b, 3c, 3d, . . . selectively disposed in an n⁻-type drift layer (n-base layer) 4, and a plurality of n⁺-type source regions 11a, 11b, . . . , 11f, . . . selectively disposed in the plurality of p⁻-type base regions 3a, 3b, 3c, 3d, . . . .

Moreover, the semiconductor device further includes a plurality of gate electrodes 7a, 7b, 7c provided respectively through gate insulating films 9a, 9b, 9c, . . . in a plurality of trenches $22_{j-1}$, $22_j$, $22_{j+1}$, . . . disposed on a principal surface (upper surface in FIG. 1) of a drift layer 4, and interlayer insulating films 8a, 8b, 8c, . . . laminated selectively on surfaces of the respective gate electrodes 7a, 7b, 7c, . . . .

Moreover, the semiconductor device further includes a barrier metal layer 6 laminated on the interlayer insulating films 8a, 8b, 8c, . . . and an electrode layer 1 laminated on the barrier metal layer 6. In the semiconductor device illustrated in FIG. 1, the electrode layer 1 corresponds to a source electrode. On an upper surface of the electrode layer 1, a passivation film (not illustrated) or the like is deposited as an outermost layer. A part of a principal surface of the electrode layer 1 disposed under the passivation film is exposed to opening portions (window portions) cut in the passivation film or the like. Bonding pads to which the wires 2 are supposed to be bonded or equivalents of the bonding pads are defined in the opening portions.

The semiconductor device illustrated in FIG. 1 further includes an n⁺-type drain layer 12 deposited on the lower side of the n⁻-type drift layer 4, and a drain electrode layer 10 joined to the lower principal surface of the drain layer 12. The lower side of the drift layer 4, on which the drain layer 12 is deposited, is an opposite side of the drift layer 4 from the electrode layer 1. The drain electrode layer 10 is joined to the opposite side of the drain layer 12 with from the drift layer 4.

Surface structures pertaining a topology including the base region 3a, 3b, 3c, 3d, . . . , the drift layer 4 and the drain layer 12 implement a major portion of the semiconductor chip of the embodiment of the present invention. The semiconductor chip serves as the principal element of the semiconductor device according to the embodiment of the present invention.

That is to say, the plurality of n⁺-type source regions 11a, 11b, . . . , 11f, . . . correspond to a plurality of first principal electrode regions periodically disposed in an upper portion of the semiconductor chip in the embodiment of the present invention, and the plurality of first principal electrode regions are first conductivity type, and are commonly electrically connected to the metallic film 1.

And the n⁺-type drain layer 12 corresponds to a second principal electrode region disposed in a lower portion of the semiconductor chip in the embodiment of the present invention, and the surface structures correspond to a plurality of control electrode structures configured to control currents flowing between the plurality of first principal electrode regions and the second principal electrode region in the embodiment of the present invention.

And the plurality of p⁻-type base regions 3a, 3b, 3c, 3d, . . . are second conductivity type, and are disposed in the upper portion of the semiconductor chip, and the n⁻-type drift layer 4 corresponds to a drift region of the first conductivity type disposed between the plurality of base regions and the second principal electrode region in the embodiment of the present invention.

And the surface structures include the gate insulating films 9a, 9b, 9c, . . . and a plurality of gate electrodes 7a, 7b, 7c disposed on the gate insulating films 9a, 9b, 9c, . . . .

And the gate insulating film 9a, 9b, 9c, . . . are provided in each of an inner surface of the plurality of trenches $22_{j-1}$, $22_j$, $22_{j+1}$, . . . disposed in the upper portion of the semiconductor chip, the plurality of trenches $22_{j-1}$, $22_j$, $22_{j+1}$, . . . penetrate from an upper side of the semiconductor chip towards the drift layer 4 so as to define positions of the plurality of base regions 3a, 3b, 3c, 3d, . . . on both sides of the plurality of trenches $22_{j-1}$, $22_j$, $22_{j+1}$, . . . .

And a plurality of gate electrodes 7a, 7b, 7c are buried in each of the plurality of trenches $22_{j-1}$, $22_j$, $22_{j+1}$, . . . .

And each of the first principal electrode regions is provided on both sides of the plurality of trenches $22_{j-1}$, $22_j$, $22_{j-1}$, . . . .

And a plurality of interlayer insulating films 8a, 8b, 8c, . . . are disposed respectively on the control electrode structures, protruding step-wise from an upper position of the plurality of base regions 3a, 3b, 3c, 3d, . . . , each of side edges of the plurality of interlayer insulating films 8a, 8b, 8c, . . . defines contact windows for connecting the first principal electrode regions to the metallic film 1, and the barrier metal layer 6 covers periodically the protruding the plurality of interlayer insulating films 8a, 8b, 8c, . . . , and the lower surface of the metallic film 1 has a plurality of grooves so as to accommodate stepped topology of the barrier metal layer 6.

And an upper portion of the drift layer 4 is sandwiched in between two of adjacent base regions among the plurality of base regions 3a, 3b, 3c, 3d, . . . .

And the gate insulating films 9a, 9b, 9c, . . . are provided on the upper portion of the drift layer 4, and are further extended toward on peripheral portions of the two of adjacent base regions.

And each of the first principal electrode regions is provided on both sides of the extended gate insulating films 9a, 9b, 9c, . . . so as to define channel region between the first principal electrode regions and the upper portion of the drift layer 4.

Figure 2:
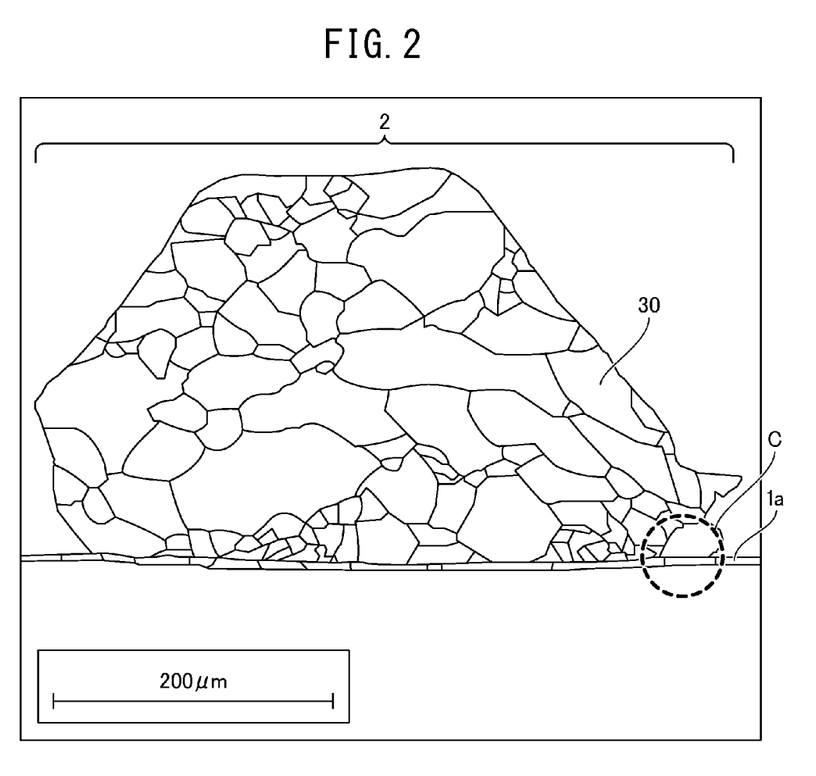
FIG. 2 is a partial cross-sectional view schematically explaining a bonding state of the electrode layer and wire of the semiconductor device according to the embodiment of the present invention.

A cross-sectional view of FIG. 2 is a cross-section obtained by imaging a junction portion between the electrode layer 1a and the wire 2 bonded to the electrode layer 1a of the semiconductor device according to the embodiment of the present invention, by using a transmission electron microscope (TEM). In FIG. 2, a plurality of grains 30 of polycrystalline particles or amorphous particles are schematically illustrated in the wire 2.

Figure 3:
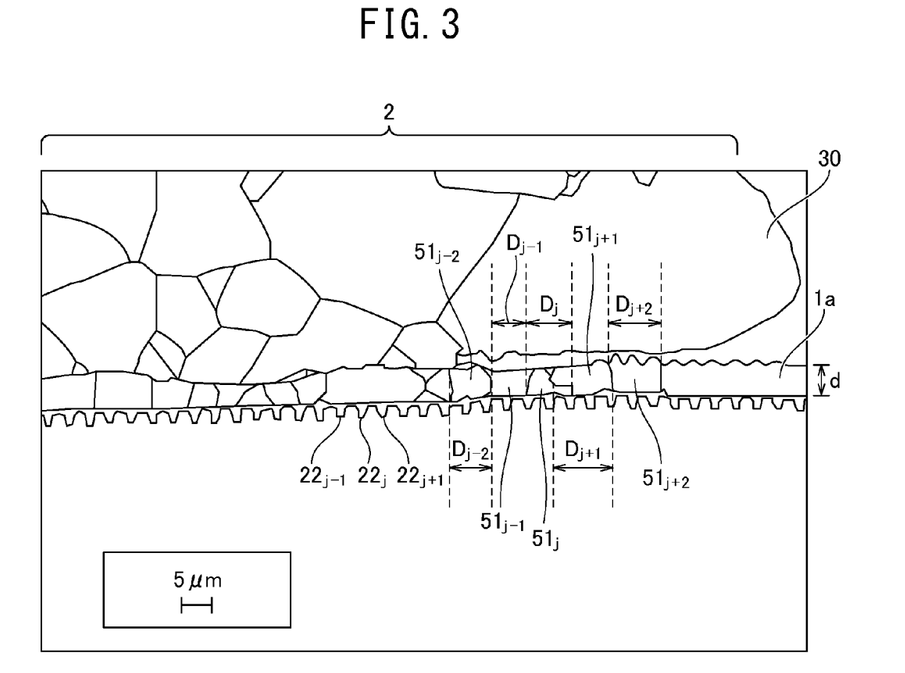
FIG. 3 is an enlarged view of a portion C in FIG. 2.

As illustrated in a cross-sectional view of FIG. 3, on an arrangement of a plurality of gates—of which numerals are not illustrated—buried in the plurality of trenches $22_{j-1}$, $22_j$, $22_{j+1}$, . . . , the electrode layer 1a with a thickness d of approximately five micrometers for example is deposited through the interlayer insulating films of which numerals are not illustrated.

The metallic film for the electrode layer 1a may be aluminum (Al) or Al alloy films including Al as a main composition element. The Al alloy film may contain suitably an alloy element such as silicon (Si), copper (Cu), nickel (Ni), magnesium (Mg) and zinc (Zn). Moreover, the electrode layer 1 is not limited to a binary alloy of Al and the metal such as Si, and for example, the electrode layer 1 may be implemented by a tertiary alloy such as Al—Si—Cu.

Figure 4A:
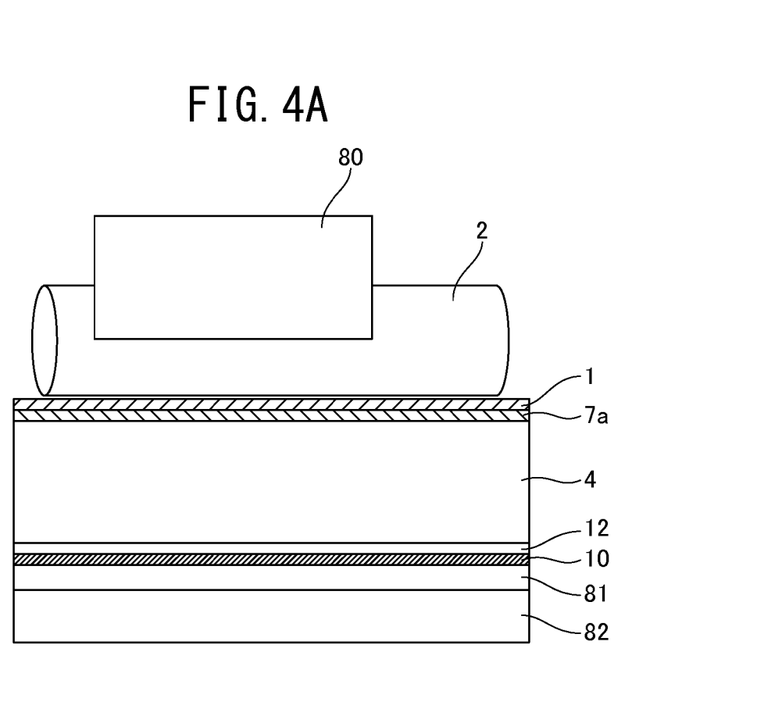
FIG. 4A is a partial cross-sectional view schematically explaining wire bonding for the semiconductor device according to the embodiment of the present invention (No. 1)
Figure 4B:
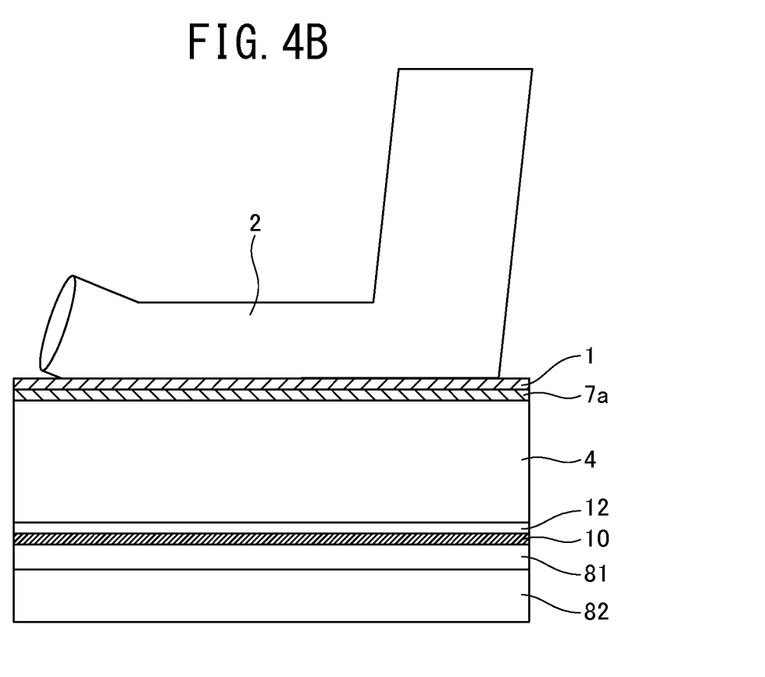
FIG. 4B is a partial cross-sectional view schematically explaining the wire bonding for the semiconductor device according to the embodiment of the present invention (No. 2)

Here, a procedure through which the wire 2 is bonded to the semiconductor device according to the embodiment of the present invention, for example, will be illustrated in FIG. 4A and FIG. 4B. The metallic electrode layer 1 as a conductive component is deposited on a surface of the semiconductor device. Note that FIG. 4A and FIG. 4B illustrate cross-sectional views of the semiconductor device, in which the gate electrode 7a on the left side in FIG. 1 is cut along a longitudinal direction of the gate electrode 7a. The longitudinal direction of the gate electrode 7a means a longer direction along which the gate electrode 7a extends. Therefore, the direction of the geometry of FIG. 1 viewed from near side to rear side of the paper and the direction of the geometry of FIG. 4A and FIG. 4B viewed from near side to rear side of the paper are orthogonal to each other. Moreover, though not illustrated in FIG. 4A and FIG. 4B, between the gate electrodes 7a, 7b, 7c, . . . , and the electrode layer 1, the interlayer insulating films 8a, 8b, 8c, . . . , are periodically deposited on upper surfaces of the gate electrodes 7a, 7b, 7c, . . . , and the barrier metal layer 6 covers upper surfaces of the interlayer insulating films 8a, 8b, 8c, . . . . In addition, on lower surfaces of the gate electrodes 7a, 7b, 7c, . . . the gate insulating films 9a, 9b, 9c, . . . are inserted between the gate electrodes 7a, 7b, 7c, . . . and the drift layer 4, as illustrated in FIG. 1.

As a process for joining the wire 2 and the surface of the semiconductor device, first, as illustrated in FIG. 4A, the wire 2 is held by a bonding tool 80, and is carried to an arbitrary appropriate site on the electrode layer 1 of the semiconductor device. In the semiconductor device, a lower surface of the drain electrode layer 10, disposed at a bottom of the drain electrode layer 10, is joined to an upper surface of a direct copper bonded (DCB) substrate 82 through a solder layer 81. Thereafter, as illustrated in FIG. 4B, the wire 2 is pressure-bonded to the electrode layer 1, as the surface of the semiconductor device, by being pressed against the electrode layer 1, being applied with ultrasonic waves by the bonding tool 80. And a lower surface of an end portion of the wire 2, disposed just beneath the bonding tool 80, and the upper surface of the electrode layer 1 are joined to each other. In that event, the wire 2 is aligned so that an axial direction of the wire 2 can be bonded in parallel with a cell direction of the semiconductor device, that is, a longitudinal direction of the gate electrodes 7a.

The electrode layer 1a is made of a metallic film, which has a plurality of grains $51_{j-2}$, $51_{j-1}$, $51_j$, $51_{j+1}$, $51_{j+2}$, . . . , as illustrated in FIG. 3. Particle diameters $D_{j-2}$, $D_{j-1}$, $D_j$, $D_{j+1}$, $D_{j+2}$, . . . of the plurality of grains $51_{j-2}$, $51_{j-1}$, $51_{j+2}$, . . . are substantially equal to or more than the thickness d of the electrode layer 1. Here, "particle diameters $D_{j-2}$, $D_{j-1}$, $D_j$, $D_{j+1}$, $D_{j+2}$, . . . are substantially equal to or more than the thickness d" includes a case where a minimum particle diameter $D_{min}$ that is the minimum value among the variation in particle diameters $D_{j-2}$, $D_{j-1}$, $D_j$, $D_{j+1}$, $D_{j+2}$, . . . is the same as the thickness d of the electrode layer 1a. However, the value of the minimum particle diameter $D_{min}$ may be set at a value that lies between a predetermined range, based on the thickness d of the electrode layer 1a. For example, it is possible to set the value of the minimum particle diameter $D_{min}$ within a range spanning approximately ±10% to 20% of the values of the thickness d of the electrode layer 1. The values of ±10% or 20% can be taken as the upper limit value and the lower limit value, respectively.

A control scheme for forming the grains $51_{j-2}$, $51_{j-1}$, $51_j$, $51_{j-1}$, $51_{j+2}$, . . . to such a particle diameter within a predetermined range can be established by adjusting a composition ratio of the alloy element such as Si, an annealing time in heat treatment and the like and managing a growth rate of the grains $51_{j-2}$, $51_{j-1}$, $51_j$, $51_{j+1}$, $51_{j+2}$, . . . , for example, in a case of deposition the electrode layer 1a by a vacuum evaporation method, a sputtering method, a chemical vapor deposition (CVD) method and the like.

Here, many movable ions of sodium (Na) and the like are present in the package, and the movable ions are easy to move to an inside of the semiconductor device depending on the electric field and the temperature. However, the movable ions are prevented from entering into the semiconductor device by the metallic electrode layer 1a and interlayer insulating films 8a, 8b, 8c, . . . of the semiconductor device. Nevertheless, if the particle diameters of the grains $51_{j-2}$, $51_{j-1}$, $51_j$, $51_{j+1}$, $51_{j+2}$, . . . of the electrode layer 1a are made small owing to the pressure of the wire bonding, and grain boundaries among the grains $51_{j-2}$, $51_{j-1}$, $51_j$, $51_{j+1}$, $51_{j+2}$, . . . are expanded so as to increase gaps between the grains $51_{j-2}$, $51_{j-1}$, $51_j$, $51_{j+1}$, $51_{j+2}$, . . . , the routes for the movable ions can be increased. Therefore, the movable ions become easy to enter the gate insulating films $9a$, $9b$, $9c$, . . . and the semiconductor region under the gate insulating films $9a$, $9b$, $9c$, . . . through the routes provided in the gaps between the grains $51_{j-2}$, $51_{j-1}$, $51_j$, $51_{j+1}$, $51_{j+2}$, . . . . Such entrance of the movable ions causes a characteristic deterioration of the semiconductor device, which includes a rise of the gate threshold voltage, heat dissipation and the like, and decreases reliability of the product.

In the semiconductor device according to the embodiment of the present invention, because the particle diameters $D_{j-2}$, $D_{j-1}$, $D_j$, $D_{j+1}$, $D_{j+2}$, . . . of the grains $51_{j-2}$, $51_{j-1}$, $51_j$, $51_{j+1}$, $51_{j+2}$, . . . of the electrode layer $1a$ are substantially equal to or more than the thickness d of the electrode layer $1a$, it is possible to suppress the damage such as the crack, which occurs in the electrode layer $1a$ owing to the power of the wire bonding, and to prevent generation of the routes through which the movable ions enter.

Moreover, hardness of the electrode layer $1a$ is set to a predetermined value with respect to the hardness of the wire. As the hardness of the electrode layer $1a$ is controlled to the predetermined hardness value, a stress to the gate insulating films $9a$, $9b$, $9c$, . . . and the base regions $3a$, $3b$, $3c$, $3d$, . . . is relieved, and the deterioration of the gate threshold voltage of the semiconductor device can be suppressed more effectively. Such a control scheme for the hardness value is performed, for example, by adjusting a composition ratio of the alloy element other than Al to Al.

Figure 5:
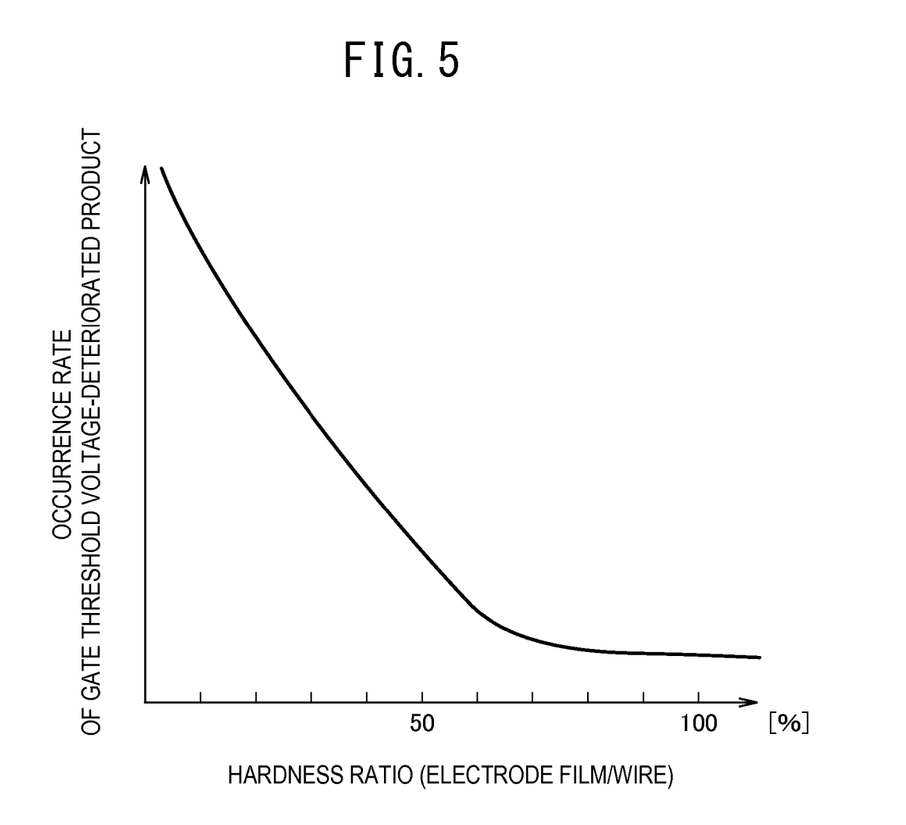
FIG. 5 is a characteristic diagram illustrating a correlation between a hardness ratio of an electrode layer to a wire and an occurrence rate of a product in which a gate threshold voltage is deteriorated.

For bonding wires of power semiconductor devices through which a large current is expected to be flown, for example, an alloy of Al and Ni is used. A diameter of the wires of the power semiconductor devices is relatively thick, and for example, is approximately 300 micrometers. Ni is added to Al for the purpose of enhancing corrosion resistance property. However, as a composition ratio of Ni to Al increases, hardness of the wire also increases. For example, in a case of an Al–Ni alloy in which Ni is added to Al by 5% in a weight basis, hardness of the Al–Ni alloy becomes approximately Hv 80, which is approximately four times hardness (approximately Hv 20) of pure Al, in terms of Vickers hardness. A ratio (hardness ratio) of the hardness of the electrode layer $1a$ to the hardness of the wire is set at at least approximately 70% or more as illustrated in FIG. 5.

That is to say, in a case where the bonding wire is Al–Ni, the hardness of the electrode layer $1a$ is set in an approximate range of Hv 14 to Hv 56 in response to the composition ratios of Ni in the wire. In a case where the hardness ratios are less than 70%, occurrence rates of defective products in which the gate threshold voltages of the semiconductor devices are deteriorated increase as illustrated in FIG. 5.

In accordance with the semiconductor devices pertaining to the embodiment of the present invention, because the particle diameters $D_{j-2}$, $D_{j-1}$, $D_j$, $D_{j+1}$, $D_{j+2}$, . . . of the grains $51_{j-2}$, $51_{j-1}$, $51_j$, $51_{j+1}$, $51_{j+2}$, . . . of the electrode layer $1a$ are controlled to be substantially equal to or more than the thickness d of the electrode layer $1a$, and in addition, because the hardness ratio of the electrode layer 1 to the wire is controlled to be 70% or more, the damage of the semiconductor devices by the wire bonding process can be suppressed effectively.

As illustrated in FIG. 1, in the upper surface of the semiconductor chip, the barrier metal layer 6 is provided on a lower surface of the electrode layer 1. The lower surface is opposite to a top surface, on which the electrode layer 1 is joined to the wire. That is to say, the barrier metal layer 6 is provided entirely under the electrode layer 1 so as to be commonly brought into contact with the plurality of interlayer insulating films $8a$, $8b$, $8c$, . . . , the $n^+$-type source regions $11a$, $11b$, . . . $11f$, . . . , and the $p^-$-type base regions $3a$, $3b$, $3c$, $3d$, . . . . The barrier metal layer 6 is a triple-level composite film including a titanium (Ti) film 63, a titanium nitride (TiN) film 62 and a titanium (Ti) film 61 stacked vertically on each other in this order from lower side. The barrier metal layer 6 is configured to suppress growth of a silicon nodule generated in such a manner that Si aggregates in the electrode layer 1.

The metal adapted for the barrier metal layer 6 may be appropriately selected as long as having a function to suppress the growth of the silicon nodule, and various refractory metals such as tungsten (W), molybdenum (Mo) and chromium (Cr) are suitably used other than titanium (Ti). The barrier metal layer 6 according to the embodiment of the present invention is deposited entirely under the electrode layer 1 so as to accommodate to a stepped shape of the gate electrodes $7a$, $7b$, $7c$, . . . as illustrated in FIG. 1, and thereby suppresses the growth of the silicon nodule in the electrode layer 1 more effectively.

Here, because the silicon nodule aggregates and grows on the lower side in the electrode layer 1, or on the side of the interlayer insulating films $8a$, $8b$, $8c$, . . . a Si concentration at the upper side in the electrode layer 1 decreases compared with the Si concentration at the lower side. Therefore, on the upper surface of the electrode layer 1, serving as the bonding surface for the wire, an influence of the damage by ultrasonic power at a time of the wire bonding increases. The growth of the silicon nodule is suppressed by the barrier metal layer 6, whereby the Si concentration at the upper surface side in the electrode layer 1 is suppressed from decreasing.

In a case where the barrier metal layer 6 is absent, the damage of the wire bonding is transmitted through the grown silicon nodule to the interlayer insulating films $8a$, $8b$, $8c$, . . . and the gate electrodes $7a$, $7b$, $7c$, . . . , and the damage reaches not only the electrode layer 1 but also such a lower level structure in the semiconductor device. Since the barrier metal layer 6 is deposited entirely on the base surface of the electrode layer 1, the damage of the wire bonding is suppressed from being transmitted to the lower level structure in the semiconductor device.

Next, a specific example of the semiconductor device according to the embodiment of the present invention will be described. The electrode layer 1 is an Al—Si film, in which the particle diameters of the grains $51_{j-2}$, $51_{j-1}$, $51_j$, $51_{j+1}$, $51_{j+2}$, . . . , corresponding to 90% or more of all the grains $51_{j-2}$, $51_{j-1}$, $51_j$, $51_{j+1}$, $51_{j+2}$, . . . that implement the electrode layer $1a$, lie in a range between ±20% of the thickness d of the electrode layer $1a$. Moreover, the wire 2 is an Al–Ni alloy having the diameter of approximately 300 micrometers. Furthermore, the hardness ratio of the electrode layer $1a$ against the wire 2 is approximately 100%. A chip size was set to be 6 millimeters×4.5 millimeters. Moreover, conditions of the wire bonding were as follows:

Ultrasonic frequency: 60 kHz
Ultrasonic output time: 180 milliseconds
Ultrasonic output: 16 watts
Diameter of ball portion: 500 micrometers
Search load: 750 gram-forces
Bonding load: 1000 gram-forces
Loop height (height of bonding wire from surface of semiconductor device): 1.5 millimeters Before and after the wire bonding process, the gate threshold voltage of the semiconductor device was measured by a gate reliability test, and then no deterioration was observed even at gate threshold voltages in the lower current regime, in which the deterioration is susceptible remarkably. Specifically, when the gate threshold voltage for flowing current of one micro ampere at room temperature was measured, a variation of the gate threshold voltages was 0.02 volt or less. At this time, as illustrated in FIG. 3, a large number of the particle diameters of grains 30, among the entire grains 30 which implement the wire 2, are larger than the particle diameters $D_{j-2}$, $D_{j-1}$, $D_j$, $D_{j+1}$, $D_{j+2}$, ... of the grains $51_{j-2}$, $51_{j-1}$, $51_j$, $51_{j+1}$, $51_{j+2}$, ... of the electrode layer 1a. Moreover, an approximate linear boundary line between the grains $51_{j-2}$, $51_{j-1}$, $51_j$, $51_{j+1}$, $51_{j+2}$, ... of the electrode layer 1a and the grains 30 of the wire 2, which extends in a horizontal direction in FIG. 3, is clearly observed.

Figure 6:
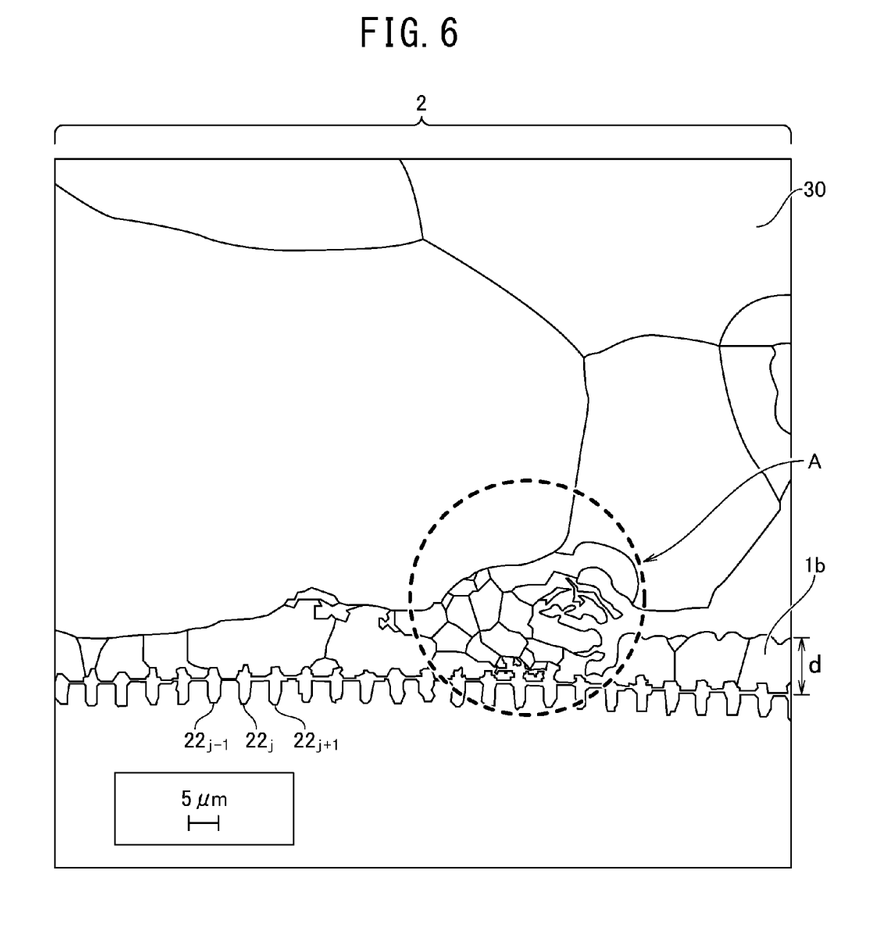
FIG. 6 is a partial cross-sectional view schematically explaining a bonding state of an electrode layer and wire of a semiconductor device according to a comparative example.

FIG. 6 illustrates a cross-sectional view of a comparative example of the present invention, obtained by imaging a cross section of a deteriorated spot in a similar way to the embodiment of the present invention illustrated in FIG. 3. The deteriorated spot is a site where the performance deterioration has occurred in a MOSFET of the comparative example, the site belonging to a junction portion of an electrode layer 1b that implements a source electrode of the MOSFET and a wire 2 bonded to the electrode layer 1b. By using a bonding tool similar to that of the embodiment of the present invention, the wire 2 is bonded to the electrode layer 1b under a similar bonding condition with the embodiment of the present invention. FIG. 6 is a partially enlarged view of a junction region of the comparative example, which corresponds to the junction region of the wire 2 and the electrode layer 1a illustrated in FIG. 3.

The comparative example is similar to the embodiment of the present invention in that the electrode layer 1b is deposited through an interlayer insulating film (of which numeral is not illustrated) on the gates (of which numerals are not illustrated) of the plurality of trenches $22_{j-1}$, $22_j$, $22_{j+1}$, .... Moreover, a structure of the wire 2 adapted for bonding is also similar to that of the embodiment of the present invention. However, the semiconductor device according to the comparative example is different from the embodiment of the present invention in that the particle diameters of the grains in the electrode layer 1b are not controlled to become substantially equal to or more than the thickness d of the electrode layer 1b. Specifically, with regard to the size of grains in the electrode layer 1b of the semiconductor device according to the comparative example, in view of the cross section of the electrode layer 1b, 50% or more number of grains among all the grains implementing the electrode layer 1b have particle diameters equal to or smaller than the value thinner by 30%, or further thinner than 30% of the thickness d of the electrode layer 1b.

Before and after the wire bonding process, a gate threshold voltage of the semiconductor device according to the comparative example was measured by the gate reliability test, and then the deterioration was observed also at the gate threshold voltage in the lower current regime. Specifically, when the gate threshold voltage for flowing current of one micro ampere at room temperature was measured, the variation of the gate threshold voltages was approximately two volts.

At this time, as illustrated by the circle A with a broken line in FIG. 6, the size of the grains of the electrode layer 1b and the grains 30 of the wire 2 are miniaturized, and a boundary between the electrode layer 1b and the wire 2 becomes vague. The circle A is a site, which is not present when the electrode layer 1b is deposited, and is generated by the wire bonding process. In the circle A, a large number of such grains smaller (by a half or more) than the thickness d of the electrode layer 1b, the thickness is defined at the time of the deposition, were generated. And in addition, the number of gaps between the grains $51_{j-2}$, $51_{j-1}$, $51_j$, $51_{j+1}$, $51_{j+2}$ in the electrode layer 1b and the grains 30 in the wire 2 becomes larger than the number of the gaps in the case of FIG. 3.

In accordance with the example of the semiconductor device according to the embodiment of the present invention, because the particle diameters $D_{j-2}$, $D_{j-1}$, $D_j$, $D_{j+1}$, $D_{j+2}$, ... of the grains $51_{j-2}$, $51_{j-1}$, $51_j$, $51_{j+1}$, $51_{j+2}$, ... of the electrode layer 1a were controlled, and in addition, because the hardness ratio of the electrode layer 1a to the wire 2 was controlled, the wire bonding can be performed so as to suppress the deterioration of the gate threshold voltage.

(Method for Manufacturing Semiconductor Device)

Next, a method for manufacturing a semiconductor device according to the embodiment of the present invention will be described. In a case that the semiconductor device is a trench-type MOSFET, first, on a surface of an n-type semiconductor substrate having a high impurity concentration, an epitaxial layer which will serves as the drift layer 4 with a predetermined impurity concentration is grown by the epitaxial growth method. Subsequently, a p⁻ layer is deposited entirely on the surface of the drift layer 4 through the ion implantation method and the like. Next, on a principal surface of the semiconductor substrate on which the p⁻ layer is deposited, a plurality of trenches $22_{j-1}$, $22_j$, $22_{j+1}$, ... is cut deeper than the p⁻ layer, whereby the p⁻ layer is divided into the plurality of p⁻-type base regions 3a, 3b, 3c, 3d, ....

Next, thin gate insulating films 9a, 9b, 9c, ... are formed in the trenches $22_{j-1}$, $22_j$ and $22_{j+1}$, ..., and thereafter, conductor films such as polycrystalline silicon films (doped polysilicon films) doped with impurities are deposited on the gate insulating films 9a, 9b, 9c, ..., so that the trenches $22_{j-1}$, $22_j$ and $22_{j+1}$, ... are buried with the conductor films. Then, by using a photolithography process and an etching process, spreading-out portions of the conductor films from the trenches $22_{j-1}$, $22_j$ and $22_{j+1}$, ... were cut so as to delineate a pattern of the gate electrodes 7a, 7b, 7c, ... on the gate insulating films 9a, 9b, 9c, ....

Then, an ion implantation mask is delineated in order that self-alignment process with the gate electrodes 7a, 7b, 7c can be enabled, and impurity ions are selectively implanted into the insides of the base regions 3a, 3b, 3c, 3d, ..., through the ion implantation mask. Thereafter, the implanted base regions 3a, 3b, 3c, 3d, ... are annealed so that the implanted impurity ions can be activated to form the n⁺-type source regions 11a, 11b, ..., 11f, .... Thereafter, after the insulating film is deposited entirely on the semiconductor substrate, the interlayer insulating films 8a, 8b, 8c, ... are delineated by the photolithography process and the etching process. Next, the Ti film 63, the TiN film 62 and the Ti film 61 are deposited in this order on such an entire surface of the semiconductor substrate, for example, by the sputtering method, and are subjected to predetermined heat treatment (for example, sintering), whereby the barrier metal layer 6 is deposited.

Next, on the barrier metal layer 6, an Al—Si alloy film is deposited so that the particles of the grains $51_{j-2}$, $51_{j-1}$, $51_j$, $51_{j+1}$, $51_{j+2}$, ... can become substantially equal to the thickness d of the electrode layer 1a. In the Al—Si alloy film, the suitable composition ratio of the alloy element to Al in the weight basis is illustrated below.

(1) In the case where the electrode layer is made of a binary alloy deposited by adding any one of the following alloy elements to Al as a main component element:

Cu: 10 ppm to 1%
Ni: 10 ppm to 0.2%
Mg: 10 ppm to 3%
Zn: 10 ppm to 1%

(2) In the case where the electrode layer is made of a tertiary alloy deposited by adding Si and another alloy element to Al as the main component element:
Si: 100 ppm to 3%
Cu: 10 ppm to 5%
Ni: 10 ppm to 1%
Mg: 10 ppm to 10%
Zn: 10 ppm to 5%

The above-described composition ratios are conditions for setting the hardness ratio of the electrode layer 1a to the wire 2 at 70% or more in consideration that the wire 2 is made of the alloy containing Ni in a range of 10 ppm to 5% with respect to Al, and that the hardness of the wire 2 approximately ranges from Hv 20 to Hv 80.

The alloy film deposited on the barrier metal layer 6 becomes the electrode layer 1a for bonding. According to requirement, the surface of the alloy film may be planarized by chemical mechanical polishing (CMP) and the like. Next, the passivation film such as a polyimide film or the like is deposited on the electrode layer 1a, and the opening portions are delineated in the passivation film, so that areas for the bonding pads to which the wires 2 are to be bonded or equivalent metallic layers as the bonding pads are exposed in the opening portion. Thereafter, the semiconductor substrate is mechanically ground from a back surface so as to reduce the thickness of the semiconductor substrate to a predetermined thinner value, and the thickness of the semiconductor substrate is adjusted, for example, to an approximate range from 10 to 400 micrometers. Next, into such a ground surface at the back surface of the semiconductor substrate, $n^+$-type impurity elements are doped with a concentration higher than that of the semiconductor substrate, for example, by ion implantation method, so as to form the drain layer 12. Moreover, a drain contact layer (not illustrated) may be deposited in a partial region of the of the drain layer 12 at the bottom surface. Thereafter, a metallic plate is joined onto the drain layer 12 or the drain contact layer, for example, by an alloy method, and the drain electrode layer 10 is formed (refer to FIG. 1). Note that the vacuum evaporation method and the sputtering method may be used for the deposition of the drain electrode layer 10. Thereafter, the semiconductor substrate is diced, and a plurality of the semiconductor chips is produced.

Next, the semiconductor chip is mounted on a predetermined position on a package such as a lead frame, and the surface of the drain electrode layer 10 is connected to the package through the solder layer 81. Then, a tip end of the wire 2 connected to an electrode terminal of the package is firmly adhered to the surface of the electrode layer 1a, at the opposite side of the semiconductor chip from the drain electrode layer 10, by an ultrasonic wire bonding tool, whereby the semiconductor device according to the embodiment of the present invention is manufactured.

At this time, because the particle diameters $D_{j-2}$, $D_{j-1}$, $D_j$, $D_{j+1}$, $D_{j+2}$, . . . of the grains $51_{j-2}$, $51_{j-1}$, $51_j$, $51_{j+1}$, $51_{j+2}$, . . . of the electrode layer 1a are controlled to be substantially equal to the thickness d of the electrode layer 1a, the damage such as the crack, which is caused by the wire bonding process, is suppressed from being given to the electrode layer 1a, and the movable ions in the package can be suppressed from entering into the semiconductor device. In addition, because the hardness ratio of the electrode layer 1a to the wire 2 is controlled to be 70% or more, the damage of the wire bonding process can be suppressed more effectively. Moreover, while various heat treatments are executed for depositing the passivation film and the drain electrode layer 10, for firmly adhering the semiconductor chip to the package, or for bonding the wire 2 to the electrode layer 1a, and so on, after the electrode layer 1a is deposited, the growth of the silicon nodule in the electrode layer 1a is suppressed by the fact that the barrier metal layer 6 is deposited.

In accordance with the method for manufacturing the semiconductor device pertaining to the embodiment of the present invention, it is not necessary to deposit the thick metallic film adapted for the electrode layer 1a, so that the metallic film have enough thickness for suppressing the damage of the wire bonding. Alternatively, it is not necessary to suppress the ultrasonic power when the wires are bonded for the same purpose. Moreover, it becomes possible to use a wire having a relatively large diameter, required for the power semiconductor device, because it is not necessary to use a wire with a small diameter for suppressing the damage of the wire bonding. Moreover, in the event of firmly adhering the drain electrode layer 10 to the package by soldering, it is not necessary to finely adjust an inclination angle between the bottom surface of the semiconductor device and the top surface of the package for suppressing the damage of the wiring bonding process. Moreover, because the wire made of a metal containing Al as a main composition element can be used, it is not necessary to use a metal such as gold (Au), which brings the manufacturing cost to relatively high. Hence, it becomes possible to manufacture the semiconductor device while suppressing the damage of the wiring including without adding an excessive architecture to the manufacturing procedure.

Other Embodiments

The description has been made of the present invention by the embodiment disclosed as above. However, it should not be understood that the description and the drawings, which form a part of this disclosure, limits the present invention. It should be conceived that, from this disclosure, varieties of alternative embodiments, examples and application technologies will be obvious for those skilled in the art.

Figure 7:
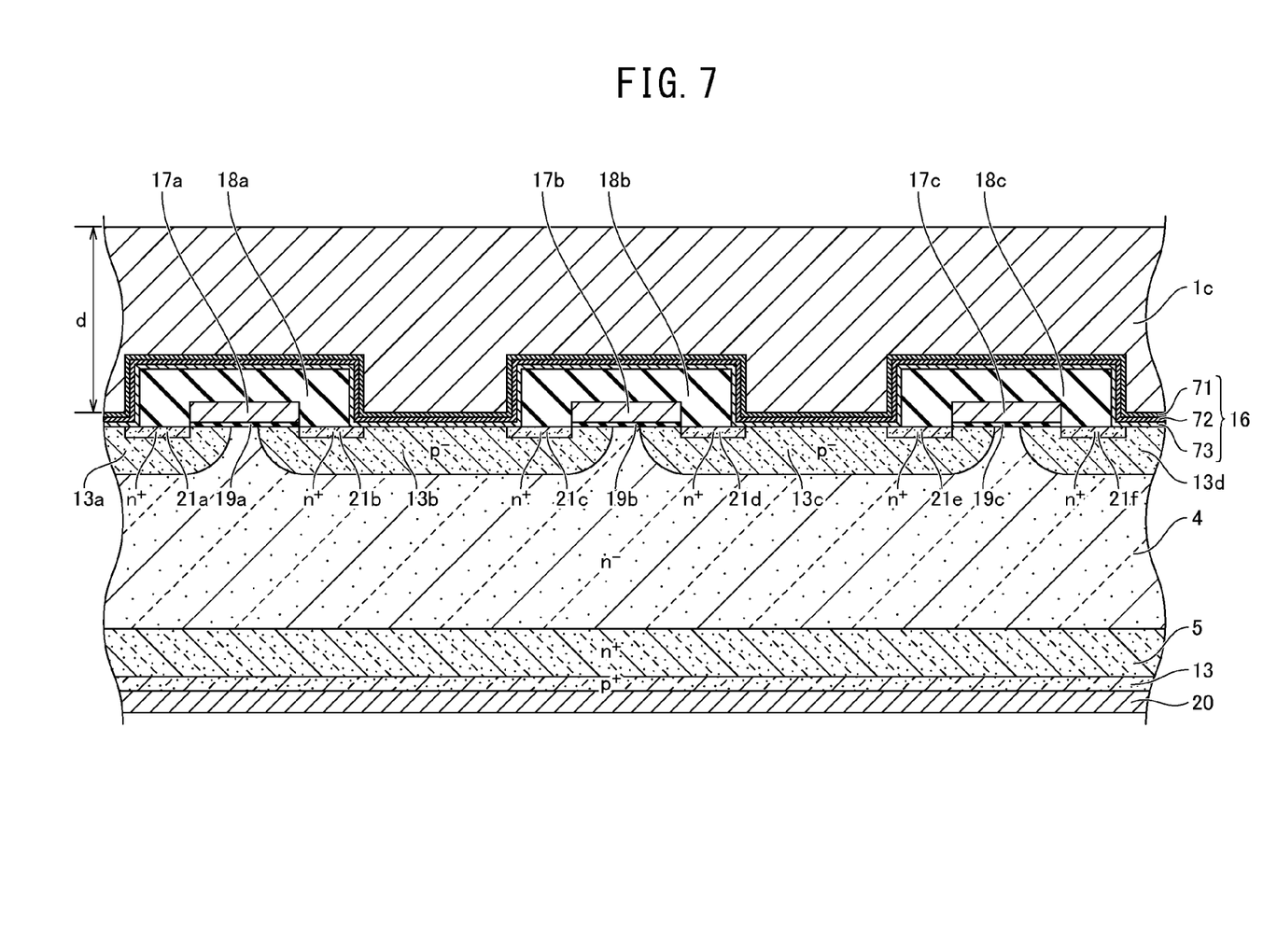
FIG. 7 is a partial cross-sectional view schematically explaining a semiconductor device according to another embodiment of the present invention.

For example, FIG. 7 illustrates a cross-sectional structure of an IGBT, as a semiconductor device according to another embodiment of the present invention. In a similar way to the MOSFET illustrated in FIG. 1, in the semiconductor device mounted on the package made of ceramics or the like, the wire is bonded to a surface of an electrode layer 1c. The semiconductor device includes a plurality of $p^-$-type base regions 13a, 13b, 13c, 13d, . . . , which are selectively disposed in an $n^-$-type drift layer 4, and $n^+$-type emitter regions 21a, 21b, . . . , 21f, . . . , which are selectively disposed in the plurality of $p^-$-type base regions 13a, 13b, 13c, . . . .

Moreover, the semiconductor device illustrated in FIG. 7 includes a plurality of gate electrodes 17a, 17b, 17c provided respectively through gate insulating films 19a, 19b, 19c, . . . laminated on a principal surface (upper surface in FIG. 7) of the plurality of $p^-$-type base regions 13a, 13b, 13c, 13d, . . . , and interlayer insulating films 18a, 18b, 18c, . . . laminated on surfaces of the respective gate electrodes 17a, 17b, 17c, . . . .

Moreover, the semiconductor device illustrated in FIG. 7 further includes a barrier metal layer 16 laminated on the interlayer insulating films 18a, 18b, 18c, . . . , and an electrode layer 1c laminated on the barrier metal layer 16. In the semiconductor device illustrated in FIG. 7, the electrode layer 1c corresponds to a source electrode. Moreover, the barrier metal layer 16 is a triple-level composite film in which a Ti film 73, a TiN film 72 and a Ti film 71 are stacked vertically on each other in this order from lower side. On an upper surface of the electrode layer 1c, a passivation film (not illustrated) or the like is deposited as an outermost layer, a principal surface of the electrode layer 1c deposited under the passivation film is exposed to opening portions (window portions) cut in the passivation film or the like, and bonding pads to which the wires are supposed to be bonded or equivalents of the bonding pads are defined in the opening portions. Moreover, the semiconductor device illustrated in FIG. 7 includes an $n^+$-type buffer layer 5 deposited on an opposite side (lower side in FIG. 7) of an $n^-$-type drift layer 4 from the electrode layer 1c, a $p^+$-type collector layer 13 deposited on an opposite side of the collector layer 13 from the drift layer 4, and a collector electrode layer 20 joined to a principal surface of the collector layer 13 on the opposite side of the collector layer 13 from the drift layer 4. Although the gate structure of FIG. 7 is illustrated as a planar gate type, the gate structure may be of the trench gate type as illustrated in FIG. 1 as a matter of course.

In a similar way to the semiconductor device illustrated in FIG. 1, in semiconductor devices according to the other embodiment of the present invention, particle diameters of grains of the electrode layer 1c are substantially equal to or more than the thickness d of the electrode layer 1c, whereby the damage such as the crack, which occurs in the electrode layer 1c owing to the power of the wire bonding, is suppressed. Moreover, in a similar way to the semiconductor device illustrated in FIG. 1, a hardness ratio of hardness of the electrode layer 1c to the hardness of the wire is controlled to be 70% or more, whereby the deterioration of the gate threshold voltage of the semiconductor device is suppressed more effectively.

As described above, the present invention incorporates varieties of embodiments and the like, which are not described in this specification and the drawings, and in addition, the technical scope of the present invention is defined only by items specifying the invention, which are according to the scope of claims reasonable based on the above description.

What is claimed is:

1. A semiconductor device comprising:
   a metallic film provided at a surface of a semiconductor chip and containing silicon;
   a wire bonded onto an upper surface of the metallic film; and
   a barrier metal layer provided on a lower surface of the metallic film, configured to suppress growth of a silicon nodule in the metallic film, wherein
   the metallic film has a plurality of grains, and particle diameters of the grains are equal to or more than a thickness of the metallic film, and
   a hardness of the metallic film is 70% or more of a hardness of the wire in terms of Vickers hardness.

2. The semiconductor device of claim 1, wherein the barrier metal layer is a triple-level composite film including titanium film, titanium nitride film and titanium film stacked in this order from lower side.

3. The semiconductor device of claim 2, wherein the semiconductor chip further comprises:
   a plurality of first principal electrode regions periodically disposed in an upper portion of the semiconductor chip, the plurality of first principal electrode regions are commonly electrically connected to the metallic film.

4. The semiconductor device of claim 3, wherein the semiconductor chip further comprises:
   a second principal electrode region disposed in a lower portion of the semiconductor chip; and
   a plurality of control electrode structures configured to control currents flowing between the plurality of first principal electrode regions and the second principal electrode region.

5. The semiconductor device of claim 4, wherein the plurality of first principal electrode regions are first conductivity type.

6. The semiconductor device of claim 5, wherein the semiconductor chip further comprises:
   a plurality of base regions of second conductivity type disposed in the upper portion of the semiconductor chip; and
   a drift region of the first conductivity type disposed between the plurality of base regions and the second principal electrode region.

7. The semiconductor device of claim 6, wherein each of the control electrode structures comprises:
   a gate insulating film; and
   a gate electrode disposed on the gate insulating film.

8. The semiconductor device of claim 7, wherein the gate insulating film is provided in an inner surface of a trench disposed in the upper portion of the semiconductor chip, the trench penetrates from an upper side of the semiconductor chip towards the drift region so as to define positions of the plurality of base regions on both sides of the trench.

9. The semiconductor device of claim 8, wherein the gate electrode is buried in the trench.

10. The semiconductor device of claim 9, wherein one of the plurality of first principal electrode regions is provided on each side of the trench.

11. The semiconductor device of claim 10, further comprising:
    a plurality of interlayer insulating films disposed respectively on the control electrode structures, protruding step-wise from an upper position of the base regions, each of side edges of the interlayer insulating films defines contact windows for connecting the first principal electrode regions to the metallic film,
    wherein the barrier metal layer covers periodically the protruding interlayer insulating films, and the lower surface of the metallic film has a plurality of grooves so as to accommodate stepped topology of the barrier metal layer.

12. The semiconductor device of claim 7, wherein an upper portion of the drift region is sandwiched in between two of adjacent base regions among the plurality of base regions.

13. The semiconductor device of claim 12, wherein the gate insulating film is provided on the upper portion of the drift region, and the gate insulating film is further extended toward and is on peripheral portions of the two of adjacent base regions.

14. The semiconductor device of claim 13, wherein one of the plurality of first principal electrode regions is provided on each side of the extended gate insulating film so as to define channel region between the first principal electrode regions and the upper portion of the drift region.

15. A method for manufacturing a semiconductor device, comprising:
    forming a barrier metal layer on a surface of a semiconductor chip;

forming a metallic film on a surface of the barrier metal layer so that particle diameters of grains in the metallic film are equal to or more than a thickness of the metallic film; and bonding a wire onto an upper surface of the metallic film; wherein the barrier metal layer is configured to suppress growth of a silicon nodule in the metallic film, and hardness of the metallic film is 70% or more of hardness of the wire in terms of Vickers hardness.

* * * * *